(12) United States Patent
Gaynes et al.

(10) Patent No.: US 9,627,784 B1
(45) Date of Patent: Apr. 18, 2017

(54) METHOD AND APPARATUS FOR STRAIN RELIEVING SURFACE MOUNT ATTACHED CONNECTORS

(71) Applicant: INTERNATIONAL BUSINESS MACHINES CORPORATION, Armonk, NY (US)

(72) Inventors: Michael A. Gaynes, Vestal, NY (US); Jeffrey D. Gelorme, Burlington, CT (US); Robert P. Kuder, II, Hopewell Junction, NY (US); Daniel J. Littrell, Carmel, NY (US); Thomas E. Lombardi, Poughkeepsie, NY (US); Marie-Claude Paquet, Quebec (CA); Frank L. Pompeo, Redding, CT (US); David L. Questad, Hopewell Junction, NY (US); James Speidell, Poughquag, NY (US); Sri M. Sri-Jayantha, Ossining, NY (US); Son K. Tran, Endicott, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 12 days.

(21) Appl. No.: 14/955,466

(22) Filed: Dec. 1, 2015

(51) Int. Cl.
| | |
|---|---|
| *H01R 12/51* | (2011.01) |
| *H01R 43/24* | (2006.01) |
| *H05K 1/18* | (2006.01) |
| *H01R 43/20* | (2006.01) |
| *H05K 3/30* | (2006.01) |
| *H01R 13/405* | (2006.01) |

(52) U.S. Cl.
CPC ........... *H01R 12/51* (2013.01); *H01R 43/205* (2013.01); *H05K 1/181* (2013.01); *H05K 3/305* (2013.01); *H05K 2201/1003* (2013.01); *H05K 2201/10015* (2013.01); *H05K 2201/10022* (2013.01); *H05K 2201/10106* (2013.01); *H05K 2201/10159* (2013.01); *H05K 2201/10166* (2013.01)

(58) Field of Classification Search
CPC ..... H01R 13/405; H01R 43/205; H01R 43/24
USPC ...... 439/127, 118, 119, 15, 26, 51, 589, 936
See application file for complete search history.

(56) References Cited

U.S. PATENT DOCUMENTS

| | | |
|---|---|---|
| 6,048,656 A | 4/2000 | Akram et al. |
| 6,207,475 B1 | 3/2001 | Lin et al. |
| 6,498,054 B1 | 12/2002 | Chiu et al. |

(Continued)

FOREIGN PATENT DOCUMENTS

JP    2006237367 A    9/2006

*Primary Examiner* — Amy Cohen Johnson
*Assistant Examiner* — Matthew T Dzierzynski
(74) *Attorney, Agent, or Firm* — Tutunjian & Bitetto, P.C.; Daniel P. Morris

(57) ABSTRACT

An interconnect structure that includes a component circuit board containing a plurality of electrical components, and a wafer connector assembly. The wafer connector assembly includes a plurality of interconnect circuit boards that are in electrical connection with the components circuit board through a plurality of rows of solder joints, the plurality of interconnect circuit boards having a connection end including at least one contact. An adhesive is present structurally reinforcing at least a row of the solder joints that is proximate to the connection end of the plurality of interconnect circuit boards of the wafer assembly.

10 Claims, 5 Drawing Sheets

(56) References Cited

U.S. PATENT DOCUMENTS

| | | | |
|---|---|---|---|
| 6,604,967 B2* | 8/2003 | Middlehurst | H01R 13/113 439/862 |
| 6,861,278 B2 | 3/2005 | Quinones et al. | |
| 7,085,095 B2 | 8/2006 | Saliba et al. | |
| 7,217,151 B2* | 5/2007 | Geibel | H01R 12/7041 439/449 |
| 7,249,411 B2* | 7/2007 | Belopolsky | H05K 3/3415 228/180.21 |
| 7,547,231 B1* | 6/2009 | Domitrovits | H01R 12/57 439/607.05 |
| 7,622,311 B1 | 11/2009 | Cha et al. | |
| 7,700,414 B1 | 4/2010 | San Antonio et al. | |
| 8,470,936 B2 | 6/2013 | Czubarow et al. | |
| 8,534,574 B2 | 9/2013 | Simion et al. | |
| 8,569,895 B2 | 10/2013 | Park et al. | |
| 8,691,626 B2 | 4/2014 | Su et al. | |
| 8,747,155 B2 | 6/2014 | Weber et al. | |
| 8,785,251 B2 | 7/2014 | Park et al. | |
| 2007/0102827 A1* | 5/2007 | Hogerton | H01L 21/561 257/778 |
| 2010/0052188 A1* | 3/2010 | Khan | H01L 23/16 257/778 |
| 2011/0171756 A1* | 7/2011 | Andry | H01L 23/49827 438/4 |
| 2014/0183248 A1 | 7/2014 | Babiarz et al. | |

* cited by examiner

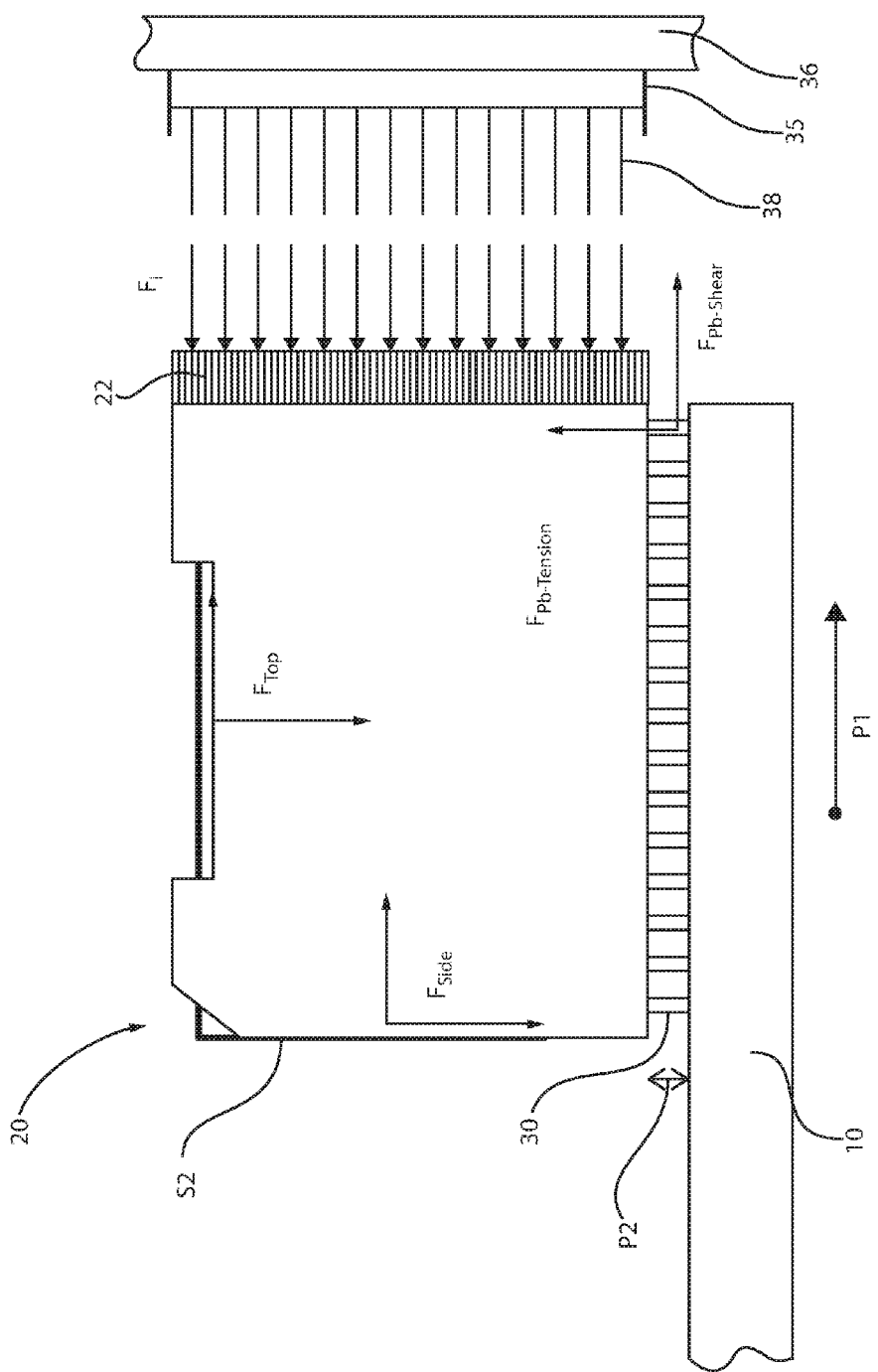

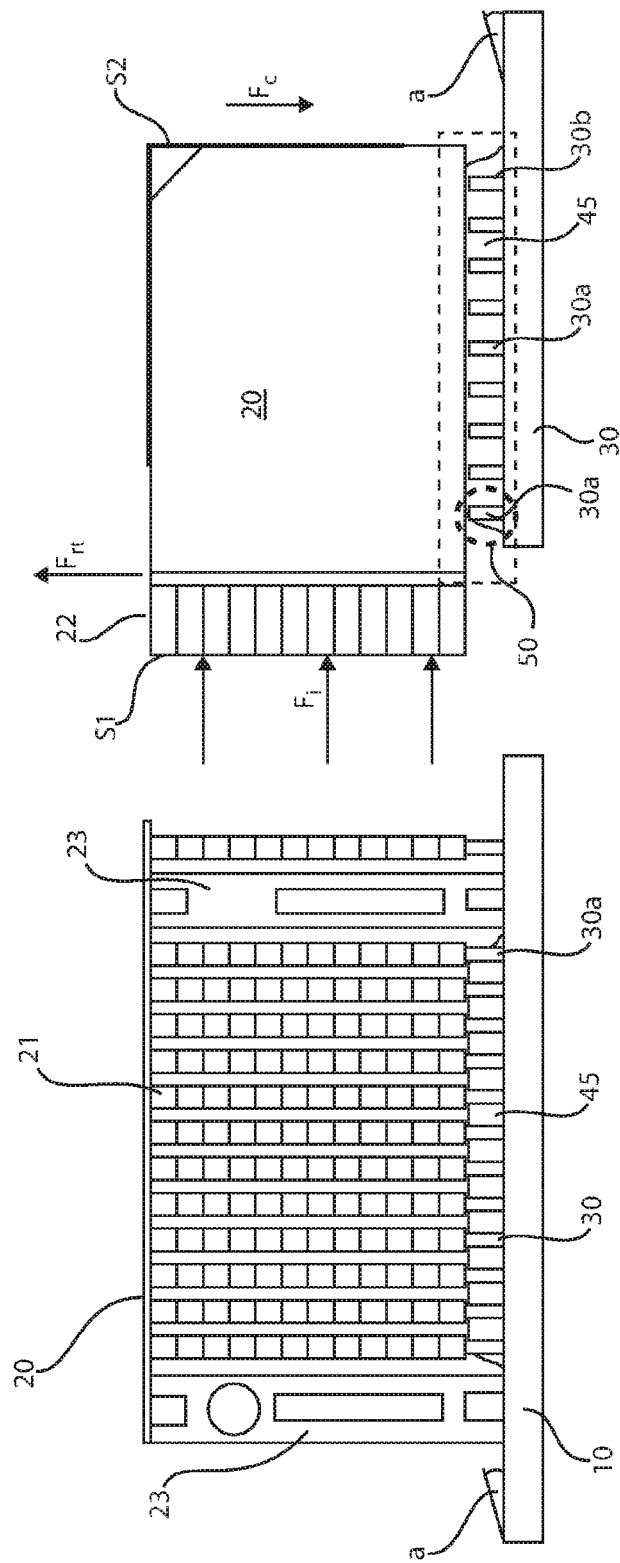

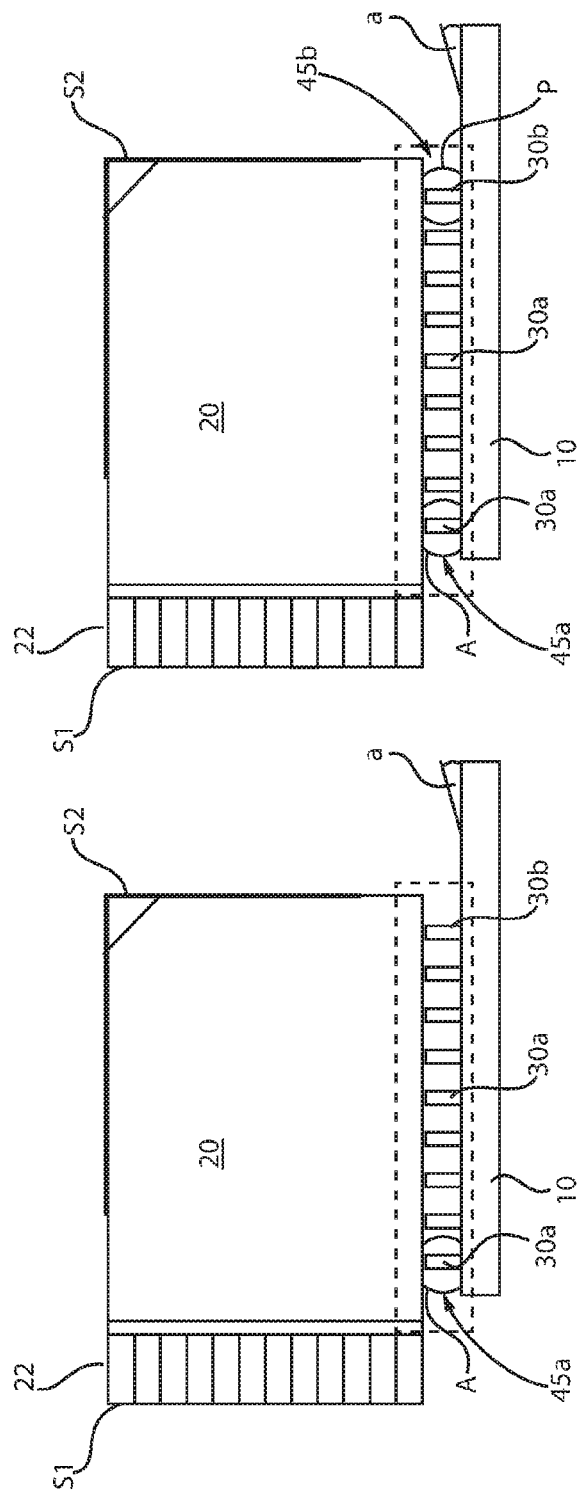

METHOD AND APPARATUS FOR STRAIN RELIEVING SURFACE MOUNT ATTACHED CONNECTORS

BACKGROUND

Technical Field

The present disclosure relates to the strain relief of solder joints between connectors and printed circuit boards.

Description of the Related Art

A design practice in electrical interconnection is strain relief. Movement or disturbance to an electrical connection can cause intermittent faults (open circuits) or catastrophic failure. Typically, separable connectors rely on plastic latches or locking parts that are integrated with plastic housings which attempt to provide controlled location and alignment of contacts. In these examples, as well as others, contact points can be sensitive to movement from mechanical disturbances caused by handling, vibration and shock.

SUMMARY

In one aspect, an interconnect to a circuit board is provided that includes an adhesive enhancement to a zone of the interconnect including solder joints that can be vulnerable to damage, e.g., by insertion force, handling, vibration and shock. In some embodiments, the interconnect to the circuit board includes a component circuit board containing a plurality of electrical components and a wafer connector assembly. The wafer connector assembly includes a plurality of interconnect circuit boards that are in electrical connection with the components circuit board through a plurality of rows of solder joints. The plurality of interconnect circuit boards include a connection end having at least one contact and a back end that is opposite the connection end. An adhesive is represent encapsulating at least a row of solder joints from said plurality of rows of solder joints that is proximate to the connection end of the plurality of interconnect circuit boards of the wafer assembly.

In another aspect, an interconnect system is provided. In some embodiments, the interconnect system includes a mid plane board for integration with a computing system the mid plane board including a header connection site; and a component circuit board for electrical engagement to the mid plane board by reversible electrical connection to the header connection site through a wafer connector assembly that is solder joint connected to the component circuit board. The wafer connector assembly includes a plurality of interconnect circuit boards that are in electrical connection with the components circuit board through a plurality of rows of solder joints. The plurality of interconnect circuit boards include a connection end having at least one contact and a back end that is opposite the connection end. An adhesive is represent encapsulating at least a row of solder joints from said plurality of rows of solder joints that is proximate to the connection end of the plurality of interconnect circuit boards of the wafer assembly.

In another aspect of the present disclosure, a method of forming an interconnect for a component circuit board is provided that includes an adhesive enhancement to a zone of the interconnect including solder joints that can be vulnerable to damage, e.g., by insertion force, handling, vibration and shock. In some embodiments, the method may include providing a component circuit board containing a plurality of electrical components. A wafer connector assembly including a plurality of interconnect circuit boards is then connected to the component circuit board with a plurality of rows of solder joints, wherein the plurality of circuit boards are in electrical communication with at least one of the components in the component circuit board through the solder joints, and the plurality of interconnect circuit boards include a connection end having at least one contact and a back end that is opposite the connection end. Encapsulating with an adhesive at least one row of solder joints from said plurality of rows of solder joints that is proximate to the connection end of the plurality of interconnect circuit boards of the wafer assembly.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 3 is a perspective view of the wafer connector assembly in electrical communication to the component circuit board through solder joints, in which the wafer connector assembly is being inserted into the header site of a mid plane board, wherein the pluggable connection is orthogonal to the plane of the solder joints, in accordance with one embodiment of the present disclosure.

FIG. 4A is a front perspective view of a wafer connector assembly solder joint connected to a component circuit board depicting the connection end of the circuit boards in the wafer connector assembly, wherein the solder joints are fully encapsulated in a reinforcing adhesive, in accordance with one embodiment of the present disclosure.

FIG. 4B is a side perspective view of the wafer connector assembly depicted in FIG. 4A.

FIG. 4C is a side perspective view of another embodiment of the wafer connector assembly including an adhesive reinforcement to only the first rows of solder joints that are proximate to the connection end of the plurality of interconnect circuit boards of the wafer connector assembly.

FIG. 4D is a side perspective view of another embodiment of the wafer connector assembly including an adhesive reinforcement to the first rows of solder joints that are proximate to the connection end of the plurality of interconnect circuit boards of the wafer connector assembly and the back rows of solder joints that are proximate to the backside end of the plurality of interconnect circuit boards of the wafer connector assembly.

DETAILED DESCRIPTION OF THE PREFERRED EMBODIMENTS

Figure 1B:
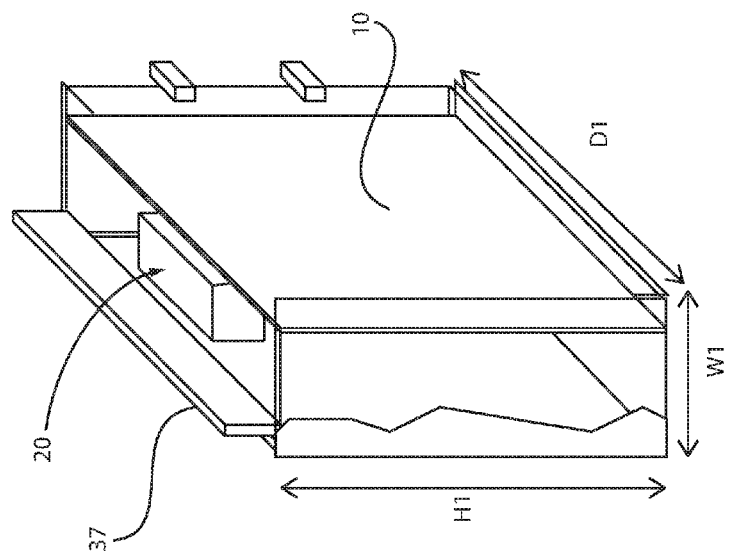
FIG. 1B is a perspective view of component circuit board, i.e., blade server board, in accordance with some embodiments of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Strain relief is a design practice in separable electrical interconnection to prevent mechanical loading to an electrical connection. However, it has been determined that strain relief has typically not been practiced with solder joints, because of the inherent strength of solder and low loads from handling, shock and vibration. In the case of solder interconnection, strict adherence to strain relief design is not followed for several reasons. Unlike a separable connector system, in some examples a solder joint is a strong, continuous metallurgical structure and not susceptible to micromotion at an interface. Further, there is typically a high number of solder joints per component unit mass and thus, any impact shock loading is much less than the yield and fracture strength of the solder joints.

Figure 1A:
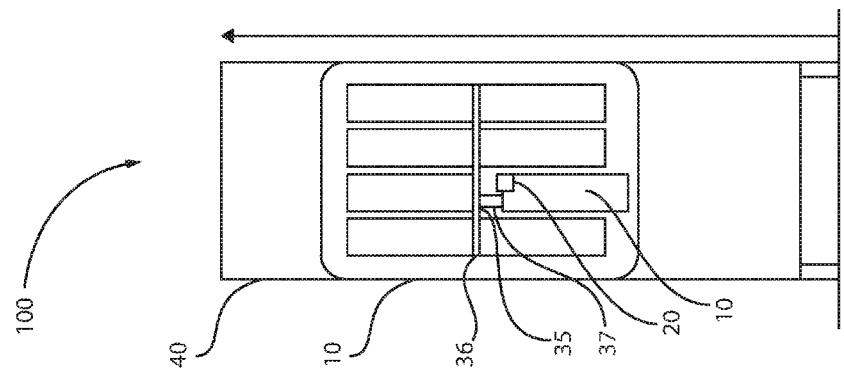
FIG. 1A is a front perspective view of a computing system including multiple blade server boards that plug into a mid plane board via mating male and female surface mount connectors that are attached to the mid plane board and blade server board assemblies respectively, in accordance with some embodiments of the present disclosure.
Figure 2:
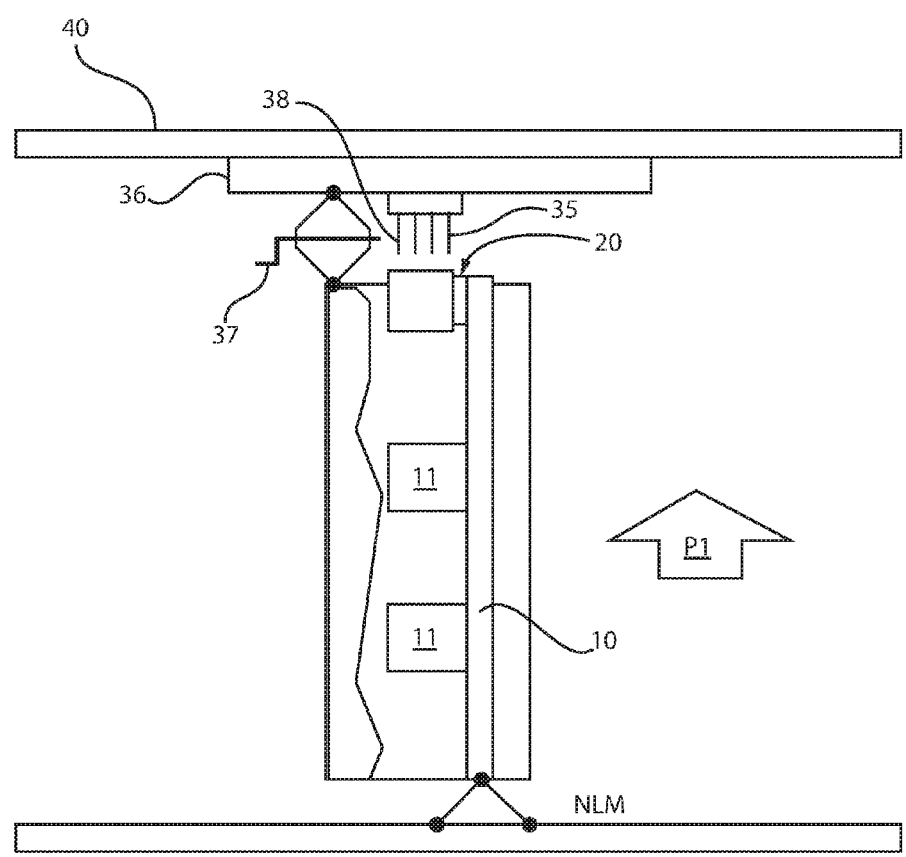
FIG. 2 is a perspective view of a single blade server board plugging into, i.e., making a reversible electrical connection to, a mid plane board, in accordance with some embodiments of the present disclosure.

However, for high end computers and servers, such as those disclosed herein, e.g., depicted in FIG. 1A, the number of input/output connections is much higher (>100×) than a typical feature option card for low end personal computers (PC), and mid-range servers and workstations. It has been determined, that in these instances, the insertion forces become significant and cannot be accomplished manually, but require mechanical assistance. An example is a connector design that requires simultaneous mating of more than 5000 blade to spring connections. The insertion forces are nominally about 55 kg which an array of an equal number of solder joint must withstand. In some examples, the connector designs require an insertion plane P1 that is orthogonal to the solder joint plane P2, as depicted in FIGS. 2 and 3. The solder joint plane P2 is along the direction of the height of the solder joints 30, which extends from the connection to the component circuit board 10 to the wafer connection assembly 20 (also referred to as ventura connector). In this case, high insertion forces ($F_i$) are preferentially transmitted to a front row or rows of solder joints and impart a peel ($F_{pb-shear}$) or tensile force ($F_{pb-tension}$). Additionally, the mechanism for insertion guidance can have a long lever arm and therefore, impart loading moments, i.e., $F_{top}$ and $F_{side}$. Solder joints 30 have been damaged in such a design, resulting in electrical opens and in cracks that are incipient in nature and represent latent or field reliability failures.

These methods and structures that are disclosed herein in some embodiments can provide strain relief to surface mount solder attached connectors. For example, the methods and structures that are disclosed herein can provide strain relief to surface mount solder attached connectors that experience high insertion forces with tensile or peel components, or insertion forces that damage solder joints, which can result in immediate or latent opens. As will be described in further detail below, a polymeric, liquid adhesive is introduced into the population of solder joints and cured. The cured properties of the adhesive allow uniform distribution of insertion forces over the entire adhesive bond area, rather than high, concentrated forces over a low percent of the total solder joint population. Repeated connector matings are possible as required for electrical testing, trouble shooting, repair and upgrade while maintaining reliable solder joint integrity. The methods and structures of the present disclosure are now described in further detail with reference to FIGS. 1A-4D.

In some embodiments, an interconnect system is provided that includes a header site 35 for integration with a computing system chassis 40; and a component circuit board 10 for reversible electrical connection to the header connection site 35 of the computing system chassis 40 through a wafer connector assembly 20 that is connected through solder joints 30 to the component circuit board 10, as depicted in FIGS. 1A and 2.

Referring to FIG. 2, the component circuit board 10 may be a printed circuit board and may include a number of electrical components 11 integrated therewith, such as memory, resistors, capacitors, light emitting diodes (LEDs), transistors, inductors, integrated circuits, and combinations thereof. Transistors integrated into the component circuit board may include field effect transistors and fin type field effect transistors. In some embodiments, the component circuit board 10 may be a blade server board.

As will be described below, the wafer connector assembly 20 includes a plurality of interconnect circuit boards 21 that are in electrical connection with the components circuit board 10 through a plurality of rows of solder joints 30, as depicted in FIGS. 3-4D. The integrated circuit boards may be laminated printed circuit boards (PCBs). In some embodiments, each of the interconnect circuit boards 21 may include at least one pin receptacle 22 (typically a plurality of pins) for engaging the pins from the header connection site 35 of the computer system 100. The pins receptacle 22 may include a conductive component, such as copper, for reversibly engaging the pins of the header connection site 35. The pins receptacle 21 may be configured for engagement to the pins at the header connection site 35. The end of the plurality of interconnect circuit boards 21 of the wafer connector assembly 20 that includes the pins 22 may be referred to as the connection end S1 of the plurality of interconnect boards 21. The end of the plurality of interconnect circuit boards 21 of the wafer connector assembly 20 that is opposite the connection end S1 may be referred to as the back side end S2 of the wafer connector assembly 20. The wafer connector assembly 20 may also include framing 23 for providing some mechanical support for the wafer connector assembly, wherein the framing may include guiding members, such as guide openings for receiving guide pins. Although FIGS. 3-4D depict a wafer connector assembly 20 including 13 interconnect circuit boards 21, the present disclosure is not limited to only this example, as any number of interconnect circuit boards 21 may be included in the wafer connector assembly 20.

A plurality of solder joints 30 provide for electrical communication between the circuits on the printed circuit boards of the plurality of interconnect circuit boards of the wafer connector assembly 20 and the circuits on the component circuit board 10. The plurality of solder joints also provide for physical engagement of the wafer connector assembly 20 to the component circuit board. The term "solder", as used herein, refers to any metal or metallic compound or alloy that is melted and then allowed to cool in order to join two or more metallic surfaces together. The plurality of solder joints 30 may be composed of a metal suitable for soldering. For example, in some embodiments, the solder joints 30 may be composed of a eutectic alloy of tin and lead or a lead free solder composition. In some embodiments, the solder joints having a height ranging from 0.5 mm to 3 mm. In other examples, the solder joints 30 have a height greater than 1 mm. In some embodiments, the array of solder joints may have a total area greater than 30 mm×200 mm.

An adhesive 45 is present encapsulating 45, 45a, 45b at least a row of solder joints 30 to structurally reinforce the plurality of rows of solder joints 30, as depicted in FIGS. 4A-4D. The adhesive 45 may be polymeric. In some embodiments, the adhesive 45 can be epoxy based resin. In some examples, the adhesive 45 can be epoxy resin with filler, epoxy acrylate with filler, or polymer with proper filler. The adhesive 45 is non-conductive. In some examples, epoxy resin formulations that may be suitable for the adhesive 45 can include, for example, high purity diglycidyl ether of bisphenol F or diglycidyl ether of bisphenol A along with high performance or multifunctional resins, such as the digylcidyl ether of naphthalene diol or the triepoxide of para-aminophenol. It is noted that this is only one example of an epoxy composition that may be used as the adhesive 45 of the present disclosure. Other adhesive compositions, and other epoxy based resins, are equally suitable for the adhesive 45 that structurally reinforces the plurality of rows of solder joints 30. Further details regarding the adhesive compositions are provided below.

FIGS. 4A and 4B depict one embodiment of the present disclosure in which the solder joints 30 are fully encapsulated in a reinforcing adhesive. By "fully encapsulated" it is meant that each solder joint 30 for every row of solder joints 30 is surrounded by an adhesive so that no point of the solder joint 30 is exposed. FIG. 4C depicts another embodiment of the wafer connector assembly 20 including an adhesive reinforcement 45a to only the first row of solder joints 30 that are proximate to the connection end S1 of the plurality of interconnect circuit boards 21 of the wafer connector assembly 20. In this embodiment, each of the solder joints 30 in the first row are encapsulated in the adhesive 45a, i.e., entirely encapsulated, but the remainder of solder joints 30 that are not in the first row and not in contact with adhesive and are exposed. FIG. 4D depicts another embodiment of the wafer connector assembly 20 including an adhesive reinforcement 45a, 45b to the first rows of solder joints 30 that are proximate to the connection end S1 of the plurality of interconnect circuit boards 21 of the wafer connector assembly 20 and the back row of solder joints 30 that are proximate to the backside end S2 of the plurality of interconnect circuit boards of the wafer connector assembly.

FIG. 1A depicts one embodiment of a computing system 100 as employed in the present disclosure including multiple blade server boards, which may be referred to as one example of a component circuit board 10, in which the blade server boards plug into a mid plane board 36. The mid plane board 36 includes the header connection site 35 and provides for engagement to the computer system chassis 40. The mid plane board 36 provides for power and signal to be transmitted to each of the component circuit boards 10 that are engaged thereto. In some embodiments, reversible electrical connection, i.e., the ability to connect and disconnect, between the header connection site 35 of the mid plane board 36 and the component circuit board 10, e.g., blade server board, may be provided by mating male and female surface mount connectors that are attached to the mid plane board and blade server board assemblies respectively. As will be discussed below, the component circuit board 10 includes a solder joint 30 mounted wafer connector assembly 20 for engaging the header connection site 35 of the mid plane board 36.

FIG. 1B depicts one embodiment of a blade server board that may provide the component circuit board 10, in accordance with the present disclosure. The typical dimensions of a blade board assembly may include a width W1 of approximately 150 mm, a height H1 of approximately 380 mm, and a depth D1 of approximately 790 mm.

Referring to FIGS. 1A and 1B, in some embodiments, mechanical handling equipment called node actuation mechanism (NAM) 37 is required to align and plug the large and heavy node-assembly, typically weighing about 70 kg, into the mid plane 36. In some embodiments, the tight spacing of the adjacent component circuit boards 10, e.g., blade assemblies, is a reason for the use of the NAM 37 for controlled insertion and removal of the blades, i.e., component circuit boards 10. As can be seen in FIG. 1A, the component circuit boards 10, e.g., blade server boards, can mate to top and bottom positions on the mid plane 36. In some embodiments, every component circuit board 10, e.g., blade server board, has a bank of connectors, e.g., that are surface mount soldered to it via an array of several thousand solder joints. Similarly, every mating position for every blade on the mid plane has a bank of connectors, called headers, which may be collectively referred to as a wafer connector assembly 20, that are surface mount soldered to the component circuit board 10 via an array of several thousand solder joints 30. The component circuit board 10 interconnects with the mid plane 36 position via separable pin and spring contacts that are housed in the surface mount connectors, i.e., wafer connector assembly 20.

It is noted that although FIG. 1A depicts eight component circuit boards 10 being engaged to a single mid plane board 36, the present disclosure is not limited to only this example, as any number of component circuit boards, as well as mid plane boards 36, may be integrated into a computer system chassis 40.

FIG. 2 shows a schematic of a component circuit board 10 being inserted to a bottom position on the mid plane board 36. In some embodiments, pins 38 extend vertically downward from the surface mount connector, i.e., header connection site 35, on the mid plane 36 and engage with female spring contacts that are housed in the surface mount connector, i.e., wafer connector assembly 20, of the blade assembly. In some embodiments, during assembly, because of the several thousand pin to spring matings required per component circuit board 10, e.g., blade server board, to the header connection site 35, e.g., to the mid plane board 25, forces on the order of 55 kg may be required to engage the component circuit board 10 to the header connection site 35.

Referring to FIGS. 3-4D, the solder joints 30 of the connector, i.e., wafer connector assembly 20, on the component circuit board 10, e.g., blade server board assembly, can experience non-uniform loading. FIG. 3 is a schematic side view illustrating a wafer connector assembly 20 soldered to a component circuit board 10, in which the pluggable connection to the header connection site 35 of the computer system chassis is in a direction orthogonal to the plane of solder joints 30. In some embodiments, the non-uniform loading experienced by the solder joints 30 that connect the wafer connector assembly 20 to the component circuit board 10 include tensile $F_{pb\text{-}tension}$ and peel components $F_{pb\text{-}shear}$ concentrated on the row of solder joints 30a closest to the mating pins to spring contacts of the wafer connector assembly 20, as shown in FIG. 3.

FIG. 4A shows a front view of the wafer connector assembly 20 and pin receptors 22, e.g., female spring contacts, for receiving the pins 38 from the header connection site 35. FIG. 4B is a view of the structure depicted in FIG. 4A rotated 90° into the page to depict a side view of the wafer connector assembly 20. The arrow identified by reference number $F_i$ is the insertion forces experienced by the wafer connector assembly 20, as the wafer connector assembly 20 is engaged to the header connection site 35. The arrow identified by reference number $F_{rt}$ is the reaction tensile force on the leading row of solder joints 35a in response to the insertion forces $F_i$. The arrow identified $F_c$ is the reaction compression force, which is a compressive force that is induced on the final row of solder joints 35b, in response to the insertion forces $F_i$.

Referring to FIG. 4B, from the side view, the leading row of solder joints 30a are visible, which are most vulnerable to damage during connector mating, i.e., engagement of the wafer connector assembly 20 into the header connector site 35 of the mid plane board 36. The next row behind the leading row is also susceptible to damage but to a lesser degree and so forth. The first few rows of solder joints 30 may be collectively referred to as the zone vulnerable to damage 50.

In order to provide a robust strain relief system for all solder joints, the adhesive material 45a is introduced to a minimum the first row of solder joints 30a, and in some examples the entirety of the zone vulnerable to damage 50, as depicted in FIG. 4C. By introducing the adhesive material 45a to the first row of solder joints 30a, the adhesive counteracts the reaction tensile force $F_{rt}$ that is induced on the front row of solder joints 30a and the zone vulnerable to damage 50 by the insertion forces experienced by the wafer connector assembly 20 when being engaged to the header connection site 35.

Referring to FIG. 4D, in some embodiments, the adhesive 45a, 45b is applied to the first row of solder joints 30a and the last row of solder joints 30b. By introducing the adhesive material 45a to the first row of solder joints 30a, the adhesive counteracts the reaction tensile force $F_{rt}$ that is induced on the front row of solder joints 30a and the zone vulnerable to damage 50 by the insertion forces experienced by the wafer connector assembly 20 when being engaged to the header connection site 35. By introducing the adhesive material 45b to the last row of solder joints 30b, the adhesive counteracts the reaction compressive force $F_c$ that is induced on the last row of solder joints 30b by the insertion forces experienced by the wafer connector assembly 20 when being engaged to the header connection site 35.

FIGS. 4A and 4B depict one embodiment of a wafer connector assembly solder joint 20 wherein all the solder joints 30 are fully encapsulated in a reinforcing adhesive 45. This means that in addition to the front row and final row 30a, 30b being encased with adhesive, all the rows of solder joints between the first and final rows 30a, 30b are also encased in their entirety.

In another aspect of the present disclosure, a method of forming an interconnect for a component circuit board is provided that includes providing a component circuit board containing 10 a plurality of electrical components 11; and electrically connecting a wafer connector assembly 20 including a plurality of interconnect circuit boards 22 to the component circuit board 10 with a plurality of rows of solder joints 30. The plurality of circuit boards 10 are in electrical communication with at least one of the components 11 in the component circuit board 10 through the solder joints 30. The method may further include encapsulating with an adhesive 45, 45a, 45b at least one row of solder joints 30, 30a, 30b from said plurality of rows of solder joints that is proximate to the connection end S1 of the plurality of interconnect circuit boards of the wafer connection assembly 20. The adhesive 45, 45a, 45b reduces strain in the solder joints 30 when the connection end S1 having at least one contact is engaged into a header site 35 of computer chassis 40. In some embodiments, the adhesive 45a, 45b, 45 composition is selected as a ball grid array (BGA) like underfill to fill the gap between the wafer connector assembly 20 (also referred to as ventura connector) and the component circuit board 10, e.g., blade server board, to provide mechanical integrity to the solder joints 30. The methods disclosed herein can provide a void-free gap fill for encapsulating at least one of the solder joints 30, and in some instances all of the solder joints 30. In some embodiments, the composition of the adhesive 45, 45a, 45b is selected to provide an adhesive material with glass transition temperature (Tg) of 75° C., CTE1 and CTE2 (coefficient of thermal expansion) of 70 and 210 ppm/° C. below and above Tg, respectively, viscosity of 3 Pa*s (or equivalent material with acceptable flow characteristics). In another embodiment, the composition of the adhesive 45 to provide an adhesive material with a Tg of 125 C, CTE1 of 31 ppm/° C., and a storage modulus of 4 GPa.

In some embodiments, the apparatus for dispensing the adhesive 45a, 45b may include at least a reservoir for containing adhesive 45a, 45b, a pumping mechanism for moving the adhesive 45a, 45b, 45c from the reservoir, a connecting tube for transmitting the pumped adhesive to a dispensing needle, and a dispensing needle for dispensing the adhesive 45a, 45b, 45c to the solder joints 30. In some embodiments, the adhesive 45a, 45b, 45c is injected under pressure from the dispensing needle uniformly within the space between the solder joints 30, 30a, 30b as well as surrounding the solder joints 30 that are present at the perimeter positions of the array of solder joints. In some embodiments, the apparatus for dispensing the adhesive 45a, 45b, 45c includes a mounting table for supporting the component circuit board 10 while applying the adhesive 45a, 45b, 45c to the rows of solder joints 30, 30a, 30b. In some embodiments, the mounting table 30 may be adjustable to change the angle of the component circuit board 10 to affect the flow of adhesive through the plurality of rows of solder joints 30, 30a, 30b during the application of the adhesive 45a, 45b, 45c. For example, the mounting table may tilt to modulate the component circuit board 10 up to 15 degrees from horizontal during the application of the adhesive 45, 45a, 45b. In other examples, the mounting table may tilt to modulate the component circuit board 10 up to 10 degrees from horizontal during the application of the adhesive 45, 45a, 45b.

In some embodiments, the adhesive 45a, 45b, 45c is dispensed at a temperature of 54° C.+/−5° C. with a dispensing needle that has an inside diameter between 0.4 mm to 0.6 mm, using multiple dispense passes. In some embodiments, because the height of the solder joints is large, e.g., greater than 1 mm, as are the x and y dimensions of the total area (>30×200 mm), gravity may be used to facilitate the introduction of the adhesive 45 to the rows and between the rows and columns of solder joints 30. The component circuit board 10 is held at a 10 degree angle α from horizontal to assist in the dispense/flow, as depicted in FIGS. 4A-4C.

In some embodiments, heating the component circuit board 10, to which the wafer connector assembly 20 is attached through the solder joints 30, also facilitates movement of the adhesive 45, 45a, 45b by allowing a reduction in viscosity. Heating of the component circuit board 10 and/or the wafer connector assembly 20 can be done by a hot plate, or enhanced tooling, which involves a heating block with several heaters in the block, to ensure that there is not a large temperature gradient across the length of the component circuit board 10 and/or the wafer connector assembly 20.

Depending on the viscosity of the adhesive 45a, 45b, 45c, the effect from gravity is controlled by adjusting the angle α from a horizontal position of a process platform that supports the component circuit board 10. In some embodiments, vision cameras are positioned at the exit side of the row of solder joints 30 that is opposite from the feed side (at which the dispensing needle injects adhesive 45, 45a, 45b) and provide a visual monitor for the appearance of the adhesive 45a, 45b, 45c. When the adhesive 45a, 45b, 45c reaches the exit side of the rows of solder joints 30a, 30b, the adjustable platform is quickly returned to a horizontal position, i.e., angle of 0 degrees, to prevent the adhesive 45a, 45b, 45c from spilling out.

Complete adhesive 45a, 45b, 45c introduction around the solder joints 30 of the connector, i.e., wafer connector assembly 20, in both x/y and z requires about 45 passes and approximately 30 g of adhesive 45a, 45b, 45c. The material is dispensed until it is seen on the exit side of the connector (by eye, or with a camera/vision system). Using enhanced tooling, all three sections of the connector can be dispensed simultaneously using three syringes, i.e., needle dispensers to decrease cycle time.

After application of the adhesive 45a, 45b, 45c, the component circuit board 10 is adjusted to horizontal (zero degrees), and the adhesive material 45a, 45b, 45c is cured in-situ using shroud heaters positioned above the wafer connector assembly 20. Cure temperature and time may be on the order of approximately 110° C. for 10 minutes. Alternatively, curing can be accomplished by placing the component circuit board 10 including the wafer connector assembly 20 in a box oven or inline furnace and using an appropriate ramp and dwell.

As noted above, in some embodiments, requiring complete encapsulation of the solder joints 30, as depicted in FIGS. 4A and 4B, complete adhesive 45a, 45b, 45c introduction around the solder joints 30 of the connector, i.e., wafer connector assembly 20, in both x/y and z requires about 45 passes and approximately 30 g of adhesive 45a, 45b, 45c. Rather than complete reinforcement of the array of solder joints, as depicted in FIGS. 4A and 4B, partial reinforcement, as depicted in FIGS. 4C and 4D, offers the advantage of less process time and less material. Partial reinforcement can be achieved by using a higher viscosity adhesive, such as Namics 1883-2. The adhesive 45a, 45b is dispensed either into the A row space (identified by "A") only, as depicted in FIG. 4C, or only into the A row space (identified by "A") and P row space (identified by "P"), as depicted in FIG. 4D.

In some embodiments, the adhesive 45, 45a, 45b is filling space between adjacent rows of solder joints 30 having a Z gap of approximately 1 mm to 2 mm in height, and a width of approximately 30 mm to 35 mm (e.g., 33 mm) and a length dimension on the order of 250 mm (10").

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An interconnect structure for a circuit board comprising:
 a component circuit board containing a plurality of electrical components;
 a wafer connector assembly including a plurality of interconnect circuit boards that are in electrical connection with the components circuit board through a plurality of rows of solder joints, the plurality of interconnect circuit boards having a connection end including at least one contact; and
 an adhesive adhering to and structurally reinforcing only a row of solder joints from said plurality of rows of solder joints that is proximate to the connection end of the plurality of interconnect circuit boards of the wafer connector assembly, wherein the adhesive adheres to each solder joint in said row of solder joints and is not present on a remainder of solder joints that do not include the first row, wherein the adhesive structurally reinforcing the solder joints relieves strain induced on said solder joints when engaging the wafer connector assembly to the header site of a mid plane board of a computing system chassis.

2. The interconnect structure of claim 1, wherein the component circuit board is a printed circuit board.

3. The interconnect structure of claim 2, wherein components of said component circuit board including memory, resistors, capacitors, light emitting diodes (LEDs), transistors, inductors, integrated circuits, and combinations thereof.

4. The interconnect structure of claim 1, wherein the adhesive structurally reinforcing the solder joints relieves strain induced on said solder joints when engaging the wafer connector assembly to the header site of a mid plane board of a computing system chassis.

5. The interconnect structure of claim 1, wherein the interconnect circuit boards are printed circuit boards including circuits for providing electrical communication from the at least one contact to solder joints of said plurality of solder joints that are connected to the printed circuit boards.

6. The interconnect structure of claim 1, wherein the adhesive comprises an epoxy based composition.

7. An interconnect system comprising:
 a header site for integration with a computing system chassis; and
 a component circuit board for reversible electrical connection to the header connection site of the computing system chassis through a wafer connector assembly that is solder joint connected to the component circuit board, the wafer connector assembly including a plurality of interconnect circuit boards that are in electrical connection with the components circuit board through a plurality of rows of solder joints, wherein an adhesive is present encapsulating at least a row of solder joints to structurally reinforce the plurality of rows of solder joints, wherein the adhesive is present only on the first row of solder joints that is in close proximity to a connection end of the plurality of interconnect circuit boards of the wafer assembly that is configured for engaging the header site of the mid plane board, wherein the adhesive comprises diglycidyl ether of bisphenol F or diglycidyl ether of bisphenol A.

8. A method of forming an interconnect for a component circuit board comprising:

providing a component circuit board containing a plurality of electrical components;

electrically connecting a wafer connector assembly including a plurality of interconnect circuit boards to the component circuit board with a plurality of rows of solder joints, wherein the plurality of circuit boards are in electrical communication with at least one of the components in the component circuit board through the solder joints, and the plurality of interconnect circuit boards include a connection end; and encapsulating with an adhesive at least one row of solder joints from said plurality of rows of solder joints that is proximate to the connection end of the plurality of interconnect circuit boards of the wafer assembly, wherein the adhesive adheres to each solder joint in said row of solder joints and is not present on a remainder of solder joints that do not include the first row, wherein the adhesive structurally reinforcing the solder joints relieves strain induced on said solder joints when engaging the wafer connector assembly to the header site of a mid plane board of a computing system chassis.

9. The method of claim 8 further comprising heating the adhesive during said encapsulation.

10. The method of claim 8 further comprising tilting the component circuit board during said encapsulating with said adhesive.

* * * * *